(12) United States Patent
Murata et al.

(10) Patent No.: US 9,460,946 B2
(45) Date of Patent: Oct. 4, 2016

(54) SUBSTRATE PROCESSING APPARATUS AND HEATING EQUIPMENT

(75) Inventors: Hitoshi Murata, Toyama (JP); Tetsuya Kosugi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 370 days.

(21) Appl. No.: 13/177,306

(22) Filed: Jul. 6, 2011

(65) Prior Publication Data
US 2012/0006506 A1    Jan. 12, 2012

(30) Foreign Application Priority Data

Jul. 9, 2010 (JP) .................................. 2010-156566
Apr. 1, 2011 (JP) .................................. 2011-081466

(51) Int. Cl.
*F24F 7/00* (2006.01)
*H01L 21/67* (2006.01)
*C23C 16/46* (2006.01)

(52) U.S. Cl.
CPC ......... *H01L 21/67109* (2013.01); *C23C 16/46* (2013.01); *C23C 16/463* (2013.01)

(58) Field of Classification Search
CPC ........... C23C 16/463; H01L 21/67109; H01L 21/22; H01L 21/31; H01L 21/324
USPC ....... 219/390, 402, 407, 409–411, 537, 416; 432/77, 82
See application file for complete search history.

(56) References Cited

U.S. PATENT DOCUMENTS

| | | | |
|---|---|---|---|
| 6,285,010 B1 * | 9/2001 | Fujikawa et al. | 219/411 |
| 7,311,520 B2 * | 12/2007 | Saito et al. | 432/247 |
| 8,134,100 B2 * | 3/2012 | Kobayashi et al. | 219/385 |
| 2005/0173396 A1 * | 8/2005 | Ooshima et al. | 219/390 |

FOREIGN PATENT DOCUMENTS

| | | | | |
|---|---|---|---|---|
| JP | 06-204155 A | | 7/1994 | |
| JP | 06204155 A | * | 7/1994 | ............. H01L 21/22 |
| JP | 2005-217335 A | | 8/2005 | |
| KR | 10-2008-0091423 A | | 10/2008 | |
| KR | 1020080091423 | * | 10/2008 | ............. H01L 21/02 |

* cited by examiner

*Primary Examiner* — Steven B McAllister
*Assistant Examiner* — Ko-Wei Lin
(74) *Attorney, Agent, or Firm* — Volpe and Koenig, P.C.

(57) ABSTRACT

A substrate processing apparatus includes a heating part including a cylindrical-shaped heat insulator and a heating wire arranged on the inner circumferential surface of the heat insulator, a heat-insulating part configured to define a cylindrical space between the heating part and the heat insulating part, a cooling gas introduction portion coupled to the cylindrical space and provided above the heat-insulating part to surround the heating part, and a cooling gas discharge portion provided at an approximately same height as that of the cooling gas introduction portion in the diameter direction extending from approximately the center of the cooling gas introduction portion.

8 Claims, 6 Drawing Sheets

SUBSTRATE PROCESSING APPARATUS AND HEATING EQUIPMENT

CROSS-REFERENCE TO RELATED APPLICATIONS

This application is based upon and claims the benefit of priority from Japanese Patent Applications Nos. 2010-156566, filed on Jul. 9, 2010; and 2011-81466, filed on Apr. 1, 2011, the entire contents of which are incorporated herein by reference.

TECHNICAL FIELD

The present disclosure relates to a substrate processing apparatus and a heating equipment.

BACKGROUND

One example of a substrate processing apparatus may include a semiconductor manufacturing apparatus. Further, as an example of the semiconductor manufacturing apparatus, there is known a vertical diffusion CVD (Chemical Vapor Deposition) apparatus.

In such a vertical diffusion CVD apparatus, a process may be performed by heating a substrate such as a semiconductor, a glass or the like. For example, the substrate is loaded in a vertical-type reaction furnace and then reaction gas is introduced into the reaction furnace. Subsequent to this, the reaction furnace is heated so that a thin film is grown in vapor-phase on the surface of the substrate. In this type of a semiconductor manufacturing apparatus, there is a need to cool a heating part (used as a heating equipment) and discharge heat generated therefrom to the exterior of the apparatus. For this purpose, Japanese Patent Laid-Open Publication No. 2005-217335 discloses an arrangement in which a heating means includes an external heat insulator defining a space between itself and a heat generator, a cooling gas introduction duct surrounding the bottom portion of the heat generator that is arranged in the space and at the bottom of the external heat insulator, to thereby introduce a cooling gas from the cooling gas introduction duct into the space.

However, in the substrate processing apparatus with the above arrangement, a large amount of heat dissipation may be generated from the rear side of the heat generator used as the heating equipment. Especially, the lower portion of the heat generator is subject to a large amount of heat dissipated from a furnace opening, which further increases a load required for dissipating the heat from the heating equipment. This shortens the lifespan of the heating equipment. In addition, the temperature in the furnace is required to be quickly lowered to improve throughput of the substrate processing apparatus.

SUMMARY

The present disclosure provides some embodiments of a substrate processing apparatus, a semiconductor device manufacturing method and a heating equipment, which can quickly reduce the temperature in a furnace to improve the process throughput while keeping the size of the apparatus minimized and prolonging the lifespan of the apparatus.

According to one embodiment of the present disclosure, there is provided a substrate processing apparatus, including: a heating part including a cylindrical-shaped heat insulator and a heating wire arranged on the inner circumferential surface of the heat insulator; a heat-insulating part configured to define a cylindrical space between the heating part and the heat insulating part; a cooling gas introduction portion coupled to the cylindrical space and provided above the heat-insulating part to surround the heating part; and a cooling gas discharge portion provided at an approximately same height as that of the cooling gas introduction portion in the diameter direction extending from approximately the center of the cooling gas introduction portion.

According to another embodiment of the present disclosure, there is provided a substrate processing apparatus, including: a heating part including a cylindrical-shaped heat insulator and a heating wire arranged on the inner circumferential surface of the heat insulator; a heat-insulating part configured to define a cylindrical space between the heating part and the heat insulating part; a top plate provided above the heating part and the heat-insulating part; a cooling gas introduction portion coupled to the cylindrical space and provided above the heat-insulating part to surround the heating part; a cooling gas discharge portion provided at an approximately same height as that of the cooling gas introduction portion in the diameter extending direction from approximately the center of the cooling gas introduction portion; a cooling gas introducing inlet configured to introduce cooling gas into the cooling gas introduction portion therethrough; and a cooling gas discharge outlet configured to discharge the cooling gas introduced into the cooling gas introduction portion to the exterior, wherein the cooling gas introducing inlet and the cooling gas discharge outlet are provided in the top plate.

According to yet another embodiment of the present disclosure, there is provided a method of manufacturing a semiconductor device, using a substrate processing apparatus including: a heating part including a cylindrical-shaped heat insulator and a heating wire arranged on the inner circumferential surface of the heat insulator; a heat-insulating part configured to define a cylindrical space between the heating part and the heat insulating part; a cooling gas introduction portion coupled to the cylindrical space and provided above the heat-insulating part to surround the heating part; and a cooling gas discharge portion provided at an approximately same height as that of the cooling gas introduction portion in the diameter direction extending from approximately the center of the cooling gas introduction portion, the method including: performing a heat process on the substrate using the heating part.

According to still yet another embodiment of the present disclosure, there is provided a method of manufacturing a semiconductor device, the method including: performing a heat process on a substrate using a heating part, the heating part including a cylindrical-shaped heat insulator and a heating wire arranged on the inner circumferential surface of the heat insulator; forming a heat-insulating part configured to define a cylindrical space between the heating part and the heat insulating part; introducing cooling gas into a cooling gas introduction portion, the cooling gas introduction portion being coupled to the cylindrical space and provided above the heat-insulating part to surround the heating part; and discharging the cooling gas introduced into the cylindrical space through a cooling gas discharge portion, the cooling gas discharge portion being provided at an approximately same height as that of the cooling gas introduction portion in the diameter direction extending from approximately the center of the cooling gas introduction portion.

According to still yet another embodiment of the present disclosure, there is provided a method of manufacturing a semiconductor device, the method including: performing a heat process on a substrate using a heating part, the heating part including a cylindrical-shaped heat insulator and a heating wire arranged on the inner circumferential surface of the heat insulator; forming a heat-insulating part configured to define a cylindrical space between the heating part and the heat insulating part; introducing cooling gas into a cooling gas introduction portion, the cooling gas introduction portion being coupled to the cylindrical space and provided above the heat-insulating part to surround the heating part, through a cooling gas introducing inlet provided in a top plate disposed above the heating part and the heat-insulating part; and discharging the cooling gas introduced into the cylindrical space through a cooling gas discharge portion, the cooling gas discharge portion being provided in the top plate disposed at an approximately same height as that of the cooling gas introduction portion in the diameter direction extending from approximately the center of the cooling gas introduction portion.

According to still yet another embodiment of the present disclosure, there is provided a heating equipment, including: a heating part including a cylindrical-shaped heat insulator and a heating wire arranged on the inner circumferential surface of the heat insulator; a heat-insulating part configured to define a cylindrical space between the heating part and the heat-insulating part; a cooling gas introduction portion coupled to the cylindrical space and provided above the heat-insulating part to surround the heating part; and a cooling gas discharge portion provided at an approximately same height as that of the cooling gas introduction portion in the diameter direction extending from approximately the center of the cooling gas introduction portion.

According to still yet another embodiment of the present disclosure, there is provided a heating equipment, including: a heating part including a cylindrical-shaped heat insulator and a heating wire arranged on the inner circumferential surface of the heat insulator; a heat-insulating part configured to define a cylindrical space between the heating part and the heat-insulating part; a top plate provided above the heating part and the heat-insulating part; a cooling gas introduction portion coupled to the cylindrical space and provided above the heat-insulating part to surround the heating part; a cooling gas discharge portion provided at an approximately same height as that of the cooling gas introduction portion in the diameter direction extending from approximately the center of the cooling gas introduction portion; a cooling gas introducing inlet configured to introduce cooling gas into the cooling gas introduction portion therethrough; and a cooling gas discharge outlet configured to discharge the cooling gas introduced into the cooling gas introduction portion to the exterior, wherein the cooling gas introducing inlet and the cooling gas discharge outlet are provided in the top plate.

DETAILED DESCRIPTION

Figure 1:
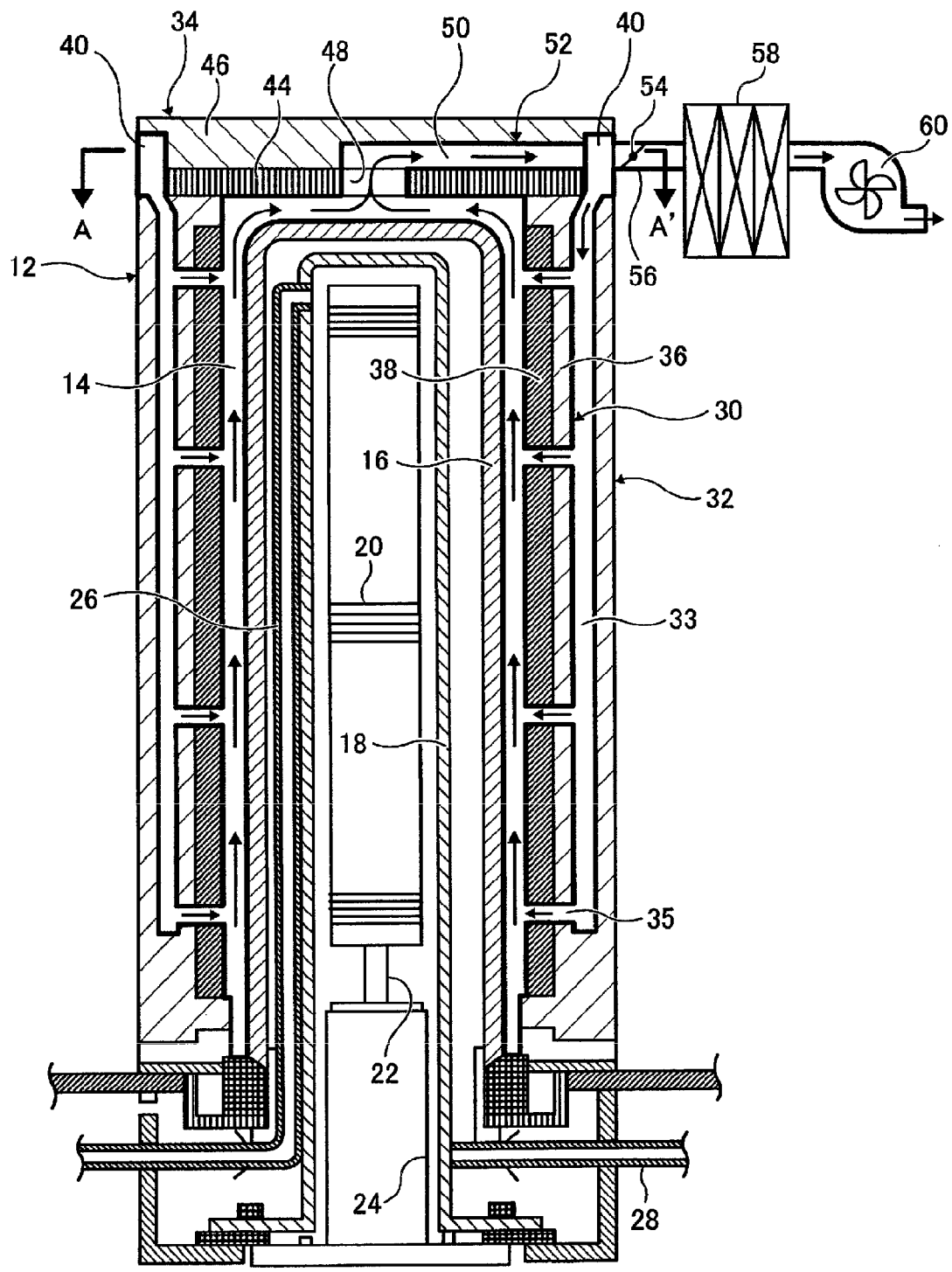
FIG. 1 is a cross-sectional view of a substrate processing apparatus according to an illustrative embodiment of the present disclosure.
Figure 2:
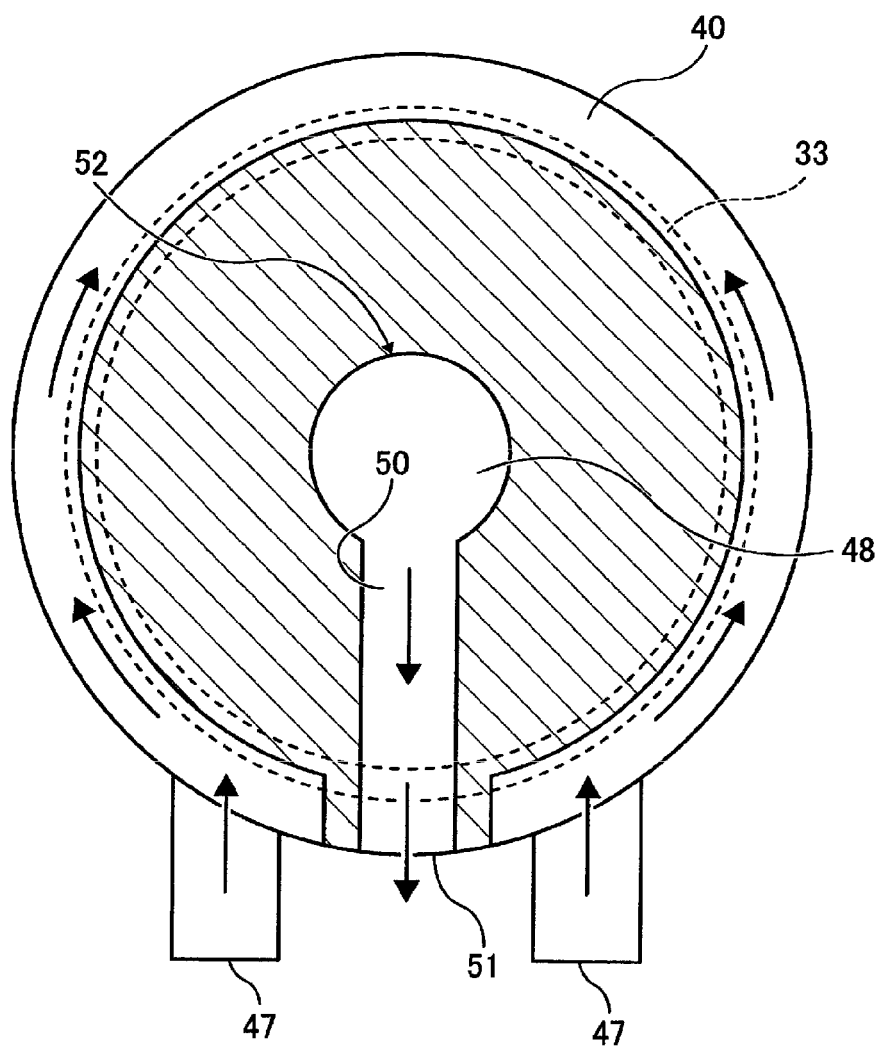
FIG. 2 is a cross-sectional view of the substrate processing apparatus taken along line A-A' in FIG. 1.
Figure 3:
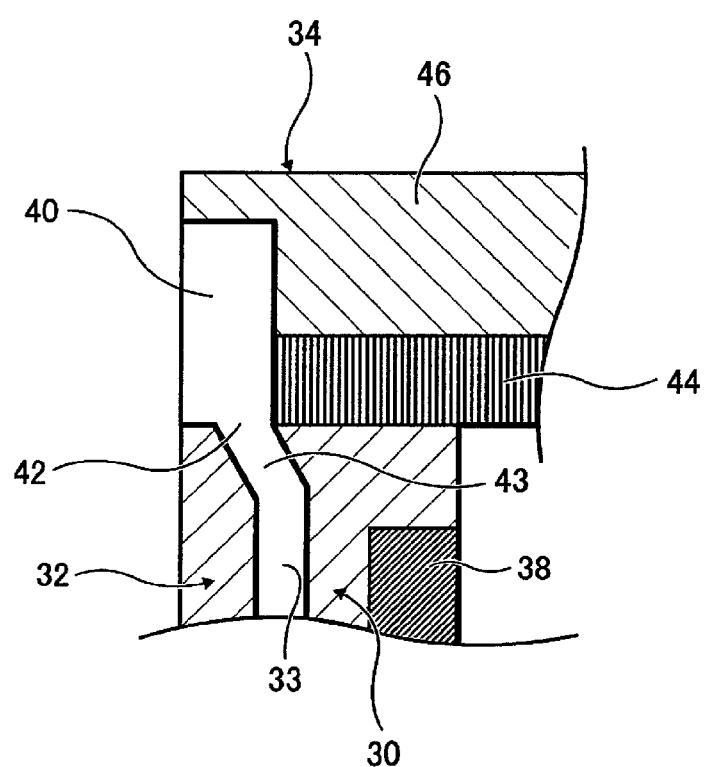
FIG. 3 is an enlarged cross-sectional view showing the periphery of a cooling gas introduction portion in the substrate processing apparatus.

A substrate processing apparatus 10 according to an illustrative embodiment of the present disclosure will now be described in detail with reference to FIGS. 1 to 3.

The substrate processing apparatus 10 according to the present embodiment includes a heating equipment 12 formed in a cylindrical shape, a soaking tube 16 formed in a cylindrical shape and provided in the heating equipment 12 with a furnace inner space 14 defined between the soaking tube 16 and the heating equipment 12, a reaction tube 18 formed in a cylindrical shape and provided in the soaking tube 16 with a gap defined between the reaction tube 18 and the soaking tube 16, and a boat 22 configured to hold a plurality of substrates 20 to be processed inside the reaction tube 18. The boat 22 holds thereon the plurality of substrates 20 in the inside of the reaction tube 18 such that the substrates are horizontally stacked and spaced apart from each other by a certain gap in a vertical direction. The boat 22 is placed on an elevator (not shown) with a boat cap 24 interposed therebetween so that it can be vertically moved by the operation of the elevator. Through the operation of the elevator, the plurality of substrates 20 may be loaded and unloaded into and from the reaction tube 18. Further, the reaction tube 18 defines a reaction chamber for accommodating the substrates 20 therein. The reaction tube 18 is in communication with a gas introduction tube 26 connected to a reaction gas supply source (not shown). Connected to the lower end portion of the reaction tube 18 is an exhaust tube 28 which is configured to exhaust (or discharge) atmosphere inside the reaction tube 18 to the exterior.

The heating equipment 12 includes a heating part 30, a heat-insulating part 32 and a top plate 34. The heat-insulating part 32 is provided in a concentric relationship with the heating part 30 with a cylindrical space 33 formed therebetween. The top opening of the heat-insulating part 32 is closed by the top plate 34.

The heating part 30 includes a cylindrical-shaped heat insulator 36 and a heating wire 38 arranged on the inner circumferential surface of the heat insulator 36. A plurality of gas outlets 35 is formed in the heating part 30 at a given distribution so that the cylindrical space 33 is substantially horizontally in communication with the furnace inner space 14. Thus, the inside of the heating part 30 defines a heating region.

The top plate 34 includes lower and upper heating-insulating plates 44 and 46, which are overlaid with each other. The lower heating-insulating plate 44 is provided to abut against the upper end of the heating part 30 and includes a circular flow hole 48 formed at the center of the lower heating-insulating plate 44 (i.e., along the central axis of the heating equipment 12). The upper heating-insulating plate 46 overlaid on the lower heating-insulating plate 44 includes a groove 50 formed thereon. The groove 50 is formed to substantially horizontally extend from a center of the upper heating-insulating plate 46 (corresponding to the flow hole 48) to a side surface of the upper heating-insulating plate 46 in the diameter direction thereof, which (i.e., the end of the groove 50) is notched to form a cooling gas discharge outlet 51 (see FIG. 2).

A cooling gas introduction portion 40 is formed in the top plate 34 positioned at the top of the heat-insulating part 32 such that it passes vertically through the outer circumferences of the lower and upper heating-insulating plates 44 and 46 and surrounds the upper portion of the heating part 30. Connected to the cooling gas introduction portion 40 are one or more (e.g., two) cooling gas introducing inlets 47, through which cooling gas is introduced. A passage opening 42 with a given width is formed on the lower surface of the cooling gas introduction portion 40. A passage hole 43 with a given width is formed to be in communication with the passage opening 42 along the circumference thereof. A lower end of the passage hole 43 is opened to communicate with the cylindrical space 33 in a direction toward the center side of the cylindrical space 33. Specifically, in the above configuration, the inner circumferential surface of the cooling gas introduction portion 40 is formed at an outer position from the inner circumferential surface of the cylindrical space 33. Such formation of the passage hole 43 allows the cooling gas to be smoothly introduced from the cooling gas introducing inlets 47 into the cylindrical space 33. Accordingly, the cooling gas introduced from the cooling gas introducing inlets 47 may flow through the cooling gas introduction portion 40, the passage opening 42, the passage hole 43, the cylindrical space 33, the gas outlets 35, the furnace inner space 14, the flow hole 48 and the groove 50, and finally discharged through the cooling gas discharge outlet 51 formed at an approximately same height as that of the cooling gas introducing inlets 47.

A cooling gas discharge portion 52 is made up by the flow hole 48, the groove 50 and the cooling gas discharge outlet 51 as described above. The cooling gas discharge portion 52 is formed at an approximately same height as that of the cooling gas introduction portion 40, extending from approximately the center of the cooling gas introduction portion 40 to the outside in a diameter direction. Connected to the cooling gas discharge outlet 51 is a heat dissipation tube 56 with a switchable damper 54 mounted therein, which is again connected to a series of a radiator 58 and a cooling fan 60. Cooling gas heated inside the heating equipment 12 may be discharged by passing through the heat dissipation tube 56, the radiator 58 and the cooling fan 60.

The cooling gas introducing inlets 47 and the cooling gas discharge outlet 51 are disposed outside the heating region and above the heating part 30 and the heat-insulating part 32. Further, the cooling gas introducing inlets 47 and the cooling gas discharge outlet 51 are formed in the top plate 34.

Deposition of a thin film on each of the substrates 20 loaded in the reaction tube 18 may be performed by the following sequence of operations: generating heat from the heating part 30 of the heating equipment 12, followed by heating the reaction tube 18 through the soaking tube 16, followed by introducing the reaction gas into the reaction tube 18 through the gas introduction tube 26, followed by exhausting atmosphere inside the reaction tube 18 through the exhaust tube 28.

Upon completion of the above deposition process, while continuing to exhaust the atmosphere within the reaction tube 18 through the exhaust tube 28, the heating operation of the heating equipment 12 is stopped and the atmosphere heated inside the reaction tube 18 is discharged to the outside, thereby decreasing the temperature within the reaction tube 18. Concurrently, the switchable damper 54 is opened and at the same time the cooling fan 60 is operated so that the cooling gas is introduced into the cooling gas introduction portion 40 through the cooling gas introducing inlets 47, which then flows through the cylindrical space 33 via the passage opening 42 and the passage hole 43. In the cylindrical space 33, the cooling gas flows downward and subsequently flows into the furnace inner space 14 through the gas outlets 35. Then, the cooling gas flown into the furnace inner space 14 again flows upward to be discharged through the cooling gas discharge portion 52, so that both inner and outer surfaces of the heating part 30 can be cooled. As a result, the cooling gas heated inside the heating equipment 12 is discharged to the exterior through the cooling gas discharge portion 52, thereby decreasing the temperature within the heating equipment 12 and thus reducing the temperature within the reaction tube 18.

After decreasing the temperature within the reaction tube 18 down to a predetermined temperature, the elevator is operated such that the boat 22 is moved down in the reaction tube 18 and then the processed substrates 20 held in the boat 22 are taken out from the reaction tube 18.

The following is a description of the operation of a substrate processing apparatus according to comparative examples.

FIRST COMPARATIVE EXAMPLE

Figure 4:
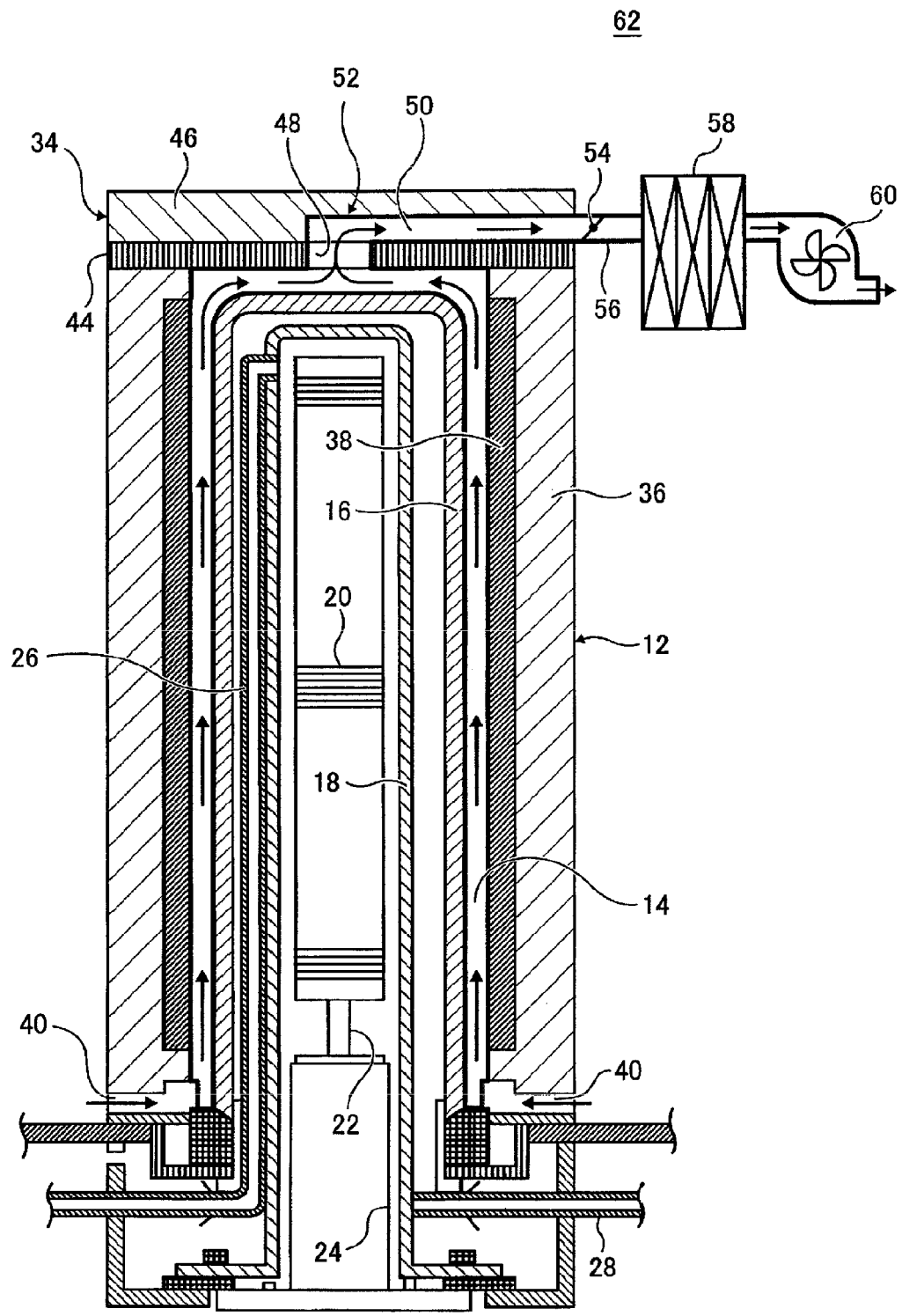
FIG. 4 is a cross-sectional view of a substrate processing apparatus according to a first comparative example.

FIG. 4 shows a configuration of a substrate processing apparatus 62 according to a first comparative example. In the following, the same reference numerals as used in the above embodiment refers to the same elements, and thus, a description thereof will be omitted to avoid duplication herein.

In the substrate processing apparatus 62 according to the first comparative example, the cooling gas introduction portion 40 is provided at the lower portion of the heating equipment 12. Further, the heating equipment 12 does not include the cylindrical space 33 therein. In such a configuration, upon completion of the deposition process, the switchable damper 54 is opened and at the same time the cooling fan 60 is operated so that the cooling gas is introduced through the cooling gas introduction portion 40 provided at the lower portion of the heating equipment 12. The introduced cooling gas flows upward along the furnace inner space 14 between the heating equipment 12 and the soaking tube 16, so that the heated atmosphere therein is discharged through the cooling gas discharge portion 52 to the outside. Thus, the temperature within the heating equipment 12 is decreased, thereby decreasing the temperature within the reaction tube 18.

In the substrate processing apparatus 62 according to the first comparative example, since the cooling gas introduction portion 40 is provided at the lower portion of the heating equipment 12, the vertical dimension of the substrate processing apparatus 62 is increased by a height of the cooling gas introduction portion 40. In addition, without the cylindrical space 33, the cooling is performed by forming a flow path of the cooling gas only in a space defined between one side of the heating part 30 and the furnace inner space 14.

SECOND COMPARATIVE EXAMPLE

Figure 5:
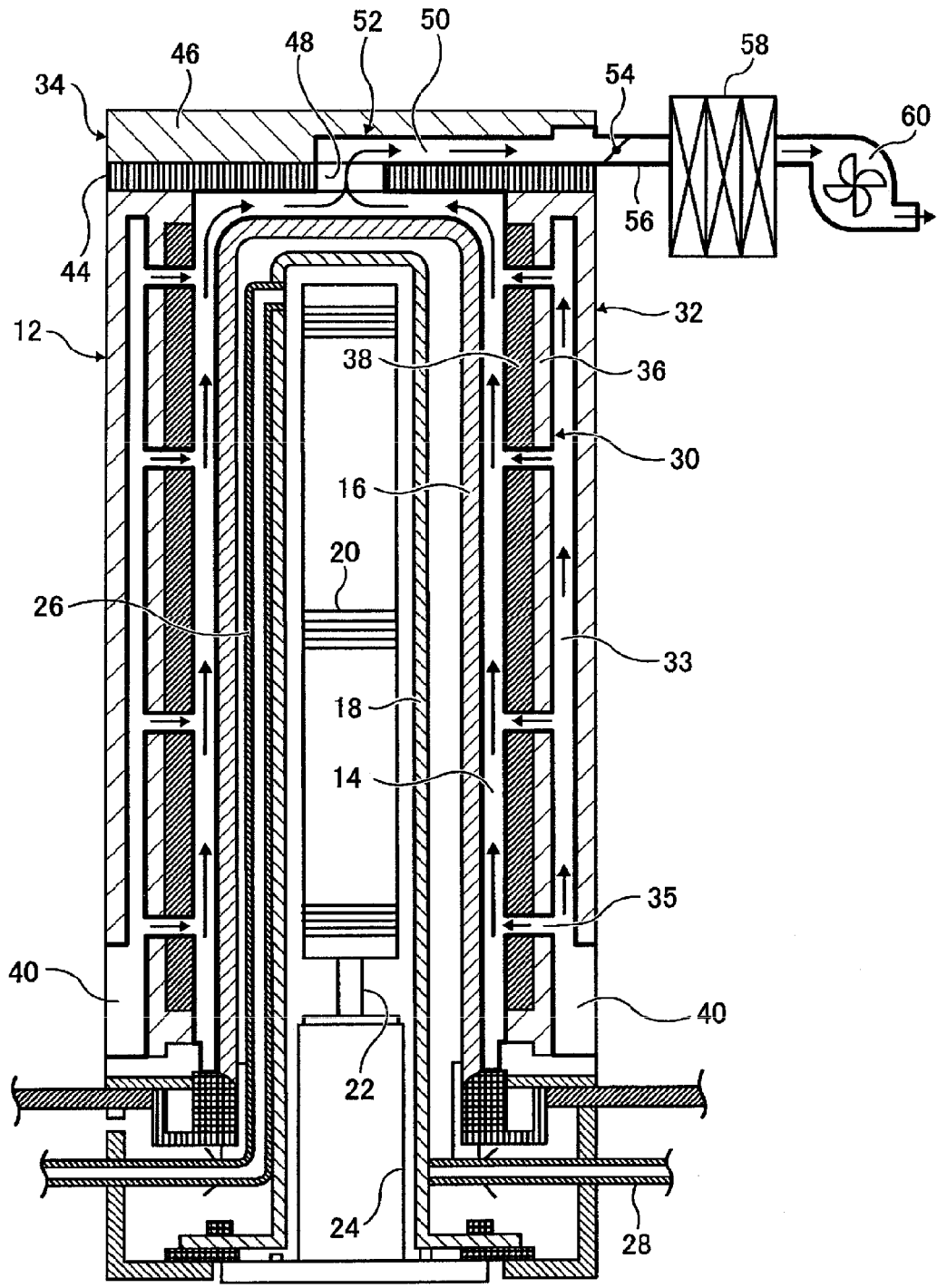
FIG. 5 is a cross-sectional view of a substrate processing apparatus according to a second comparative example.

FIG. 5 shows a configuration of a substrate processing apparatus 70 according to a second comparative example. In the substrate processing apparatus 70 according to the second comparative example, the cooling gas introduction portion 40 is provided on the side surface of the lower portion of the heating equipment 12. In such a configuration, upon completion of the deposition process, the switchable damper 54 is opened and at the same time the cooling fan 60 is operated so that the cooling gas is introduced through the cooling gas introduction portion 40 provided on the side surface of the lower portion of the heating equipment 12. The introduced cooling gas flows upward along the furnace inner space 14 while passing through the cylindrical space 33 and the gas outlets 35, so that the heated atmosphere therein is discharged through the cooling gas discharge portion 52 to the outside. Thus, the temperature within the heating equipment 12 is decreased, thereby decreasing the temperature within the reaction tube 18.

In the substrate processing apparatus 70 according to the aforementioned second comparative example, the vertical dimension of the substrate processing apparatus 70 may not be increased (e.g., by the height of the cooling gas introduction portion 40 as in the first comparative example). However, since the lower portion of the heating part is cooled more quickly than the upper part, an amount of heat dissipated from the rear side of the heating part 30 in the side surface of the heating equipment 12 may be increased. Particularly, since the lower portion of the substrate processing apparatus 70 may be subject to a significant amount of heat dissipation from the furnace opening, which causes a significant stress on the heating equipment 12. This may shorten the lifespan of the heating equipment 12.

THIRD COMPARATIVE EXAMPLE

Figure 6:
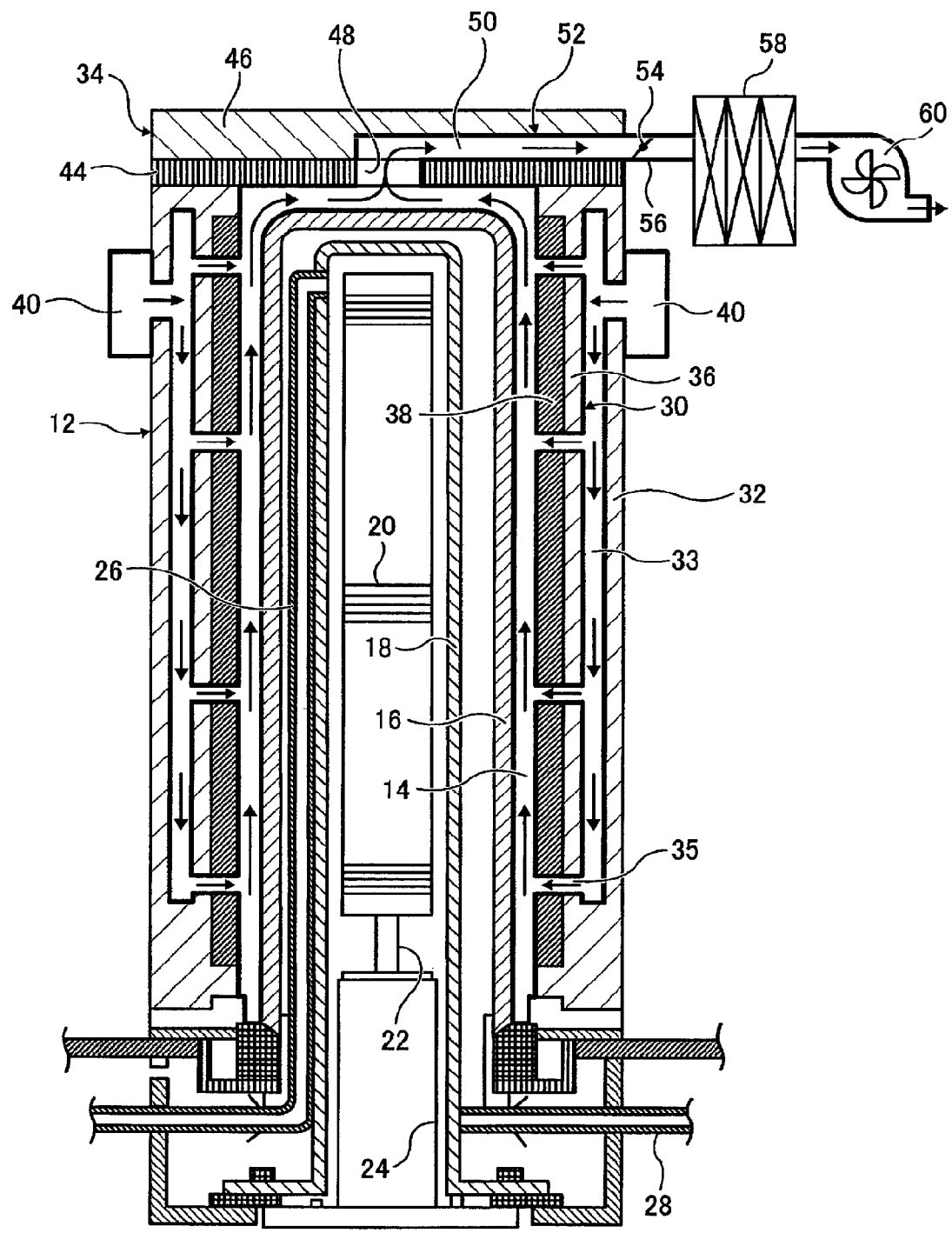
FIG. 6 is a cross-sectional view of a substrate processing apparatus according to a third comparative example.

FIG. 6 shows a configuration of a substrate processing apparatus 80 according to a third comparative example. In the substrate processing apparatus 80 according to the third comparative example, the cooling gas introduction portion 40 is provided on the side surface of the upper portion of the heating equipment 12. In such a configuration, upon completion of the deposition process, the switchable damper 54 is opened and at the same time the cooling fan 60 is operated so that the cooling gas is introduced through the cooling gas introduction portion 40 provided on the side surface of the upper portion of the heating equipment 12. The introduced cooling gas flows along the furnace inner space 14 while passing through the cylindrical space 33 and the gas outlets 35, so that the heated atmosphere therein is discharged through the cooling gas discharge portion 52 to the outside. Thus, the temperature within the heating equipment 12 is decreased, thereby decreasing the temperature within the reaction tube 18.

In the substrate processing apparatus 80 according to the aforementioned third comparative example, since the cooling gas introduction portion 40 is provided on the side surface of the upper portion of the heating equipment 12, the horizontal dimension of the heating equipment 12 may be increased, which causes increase in an external dimension of an apparatus containing the heating equipment 12 therein.

In contrast, in the substrate processing apparatus 10 according to the above embodiment of the present disclosure, where the cooling process is performed by exhausting (or discharging) the heated atmosphere through the cooling gas discharge portion 52, the cooling gas introduction portion 40 is provided above the heating equipment 12 and also is provided above the heat insulator such that it surrounds the heating part 30 and is in communication with the cylindrical space 33. Further, the cooling gas discharge portion 52 is provided at an approximately same height as that of the cooling gas introduction portion 40 in a diameter direction extending from approximately the center of the cooling gas introduction portion 40. This makes it possible to implement the configuration of the heating equipment 12 in a compact size, which in turn reduces the size of the substrate processing apparatus containing the heating equipment 12. Further, since the cooling gas introduction portion 40 is not provided on the rear surface of the heating part 30, the amount of heat dissipation generated therefrom may be decreased. Thus, the inside of the furnace may be uniformly and efficiently cooled, and thus quickly reduces the temperature within the reaction tube 18 so that the temperature of the substrates 20 can be quickly reduced down to a predetermined temperature at which the substrates 20 can be unloaded from the reaction furnace. This results in an enhanced throughput and prolongs the lifespan of the heating equipment 12.

In the foregoing embodiments, the substrate processing apparatus has been explained to have the soaking tube 16. However, the present disclosure may not be limited thereto, but may be applicable to a substrate processing apparatus without the soaking tube 16, which may have the same effect as the foregoing embodiments. Furthermore, while in the foregoing embodiments the heating equipment 12 formed in the cylindrical shape is employed, it has been presented by way of example only, but may not be limited thereto. Indeed, the present disclosure is also applicable to any cylindrical heaters having various cross sectional shapes. Further, the shape of the lower and upper heating-insulating plates 44 and 46 may not be limited to the disc-shaped, it may be varied according to the cross-sectional shape of the heating equipment 12 as long as they can air-tightly seal the top end of the heating equipment 12.

Further, while in the foregoing embodiments the passage hole 43 (configured to allow the cooling gas introduction portion 40 and the cylindrical space 33 to be in communication with each other) is formed along the circumference direction of the cooling gas introduction portion 40 with a predetermined width, the present disclosure may not be limited thereto. For example, alternatively, the present disclosure is applicable to a configuration in which the cooling gas introduction portion 40 and the cylindrical space 33 are directly in communication with each other without providing the passage hole 43 therebetween.

Furthermore, while in the foregoing embodiments two cooling gas introducing inlets 47 are provided, the present disclosure may not be limited thereto, but may employ a single cooling gas introduction inlet.

Furthermore, the above embodiments may be related to semiconductor manufacturing technology and, more particularly, heat treatment technology, where substrates are loaded and processed in a processing chamber while they are being heated by a heating unit. For example, the above embodiments may be effectively applied to a substrate processing apparatus in which semiconductor wafers including semiconductor integrated circuit devices (semiconductor devices) fabricated thereon are subjected to oxidation, diffusion or ion implantation, and then subjected to reflow or annealing for carrier activation and planarization, and thermal-CVD film formation.

Accordingly, the above embodiments may have the effects of quickly reducing the temperature in a furnace to improve the process throughput while keeping the size of the apparatus minimized and prolonging the lifespan of the apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a heating part including a heating wire arranged on the inner circumferential surface of a cylindrical-shaped heat insulator;
a heat-insulating part spaced apart from the heating part to form a cylindrical space that is provided outside the heating part and inside the heat-insulating part;
a top plate provided above the heating part and the heat-insulating part;
a cooling gas introduction portion formed inside the top plate at a top of the heat-insulating part to surround an upper portion of the heating part, wherein an inner circumferential surface of the cooling gas introduction portion is formed at an outer position from an inner circumferential surface of the cylindrical space;
a passage opening and a passage hole are provided below the cooling gas introduction portion to couple the cooling gas introduction portion and the cylindrical space, wherein the passage hole is inclined inwardly to connect the passage opening and the cylindrical space;
a cooling gas discharge portion including a gas flow passage horizontally extending from the center of the top plate to a side surface of the top plate; and
a plurality of gas outlets which allow the cylindrical space to be in communication with an inner space from the heating wire;
wherein the cooling gas introduction portion and the cooling gas discharge portion are vertically aligned such that a horizontal plane passes through the cooling gas introduction portion and the cooling gas discharge portion.

2. The apparatus of claim 1, further comprising: a cooling gas introducing inlet configured to introduce cooling gas into the cooling gas introduction portion therethrough,
wherein the cooling gas discharge portion includes a cooling gas discharge outlet configured to discharge the cooling gas introduced into the cooling gas introduction portion to an exterior of the substrate processing apparatus,
wherein the cooling gas introducing inlet and the cooling gas discharge outlet are provided outside a heating region above the heating part.

3. The apparatus of claim 2, wherein the cooling gas introducing inlet and the cooling gas discharge outlet are provided in the top plate.

4. The substrate processing apparatus of claim 1, wherein the top plate includes:
a lower heating-insulating plate provided to abut against the upper end of the heating part and including a flow hole formed at the center of the lower heating-insulating plate; and
a upper heating-insulating plate provided on the lower heating-insulating plate and including a groove horizontally extending from a center corresponding to the flow hole to a sidewall surface.

5. A heating equipment, comprising:
a heating part including a heating wire arranged on the inner circumferential surface of a cylindrical-shaped heat insulator;
a heat-insulating part spaced apart from the heating part to form a cylindrical space that is provided outside the heating part and inside the heat-insulating part;
a top plate provided above the heating part and the heat-insulating part;
a cooling gas introduction portion formed inside the top plate at a top of the heat-insulating part to surround an upper portion of the heating part, wherein an inner circumferential surface of the cooling gas introduction portion is formed at an outer position from an inner circumferential surface of the cylindrical space; a passage opening and a passage hole are provided below the cooling gas introduction portion to couple the cooling gas introduction portion and the cylindrical space, wherein the passage hole is inclined inwardly to connect the passage opening and the cylindrical space;
a cooling gas discharge portion including a gas flow passage horizontally extending from the center of the top plate to a side surface of the top plate; and
a plurality of gas outlets which allow the cylindrical space to be in communication with an inner space from the heating wire;
wherein the cooling gas introduction portion and the cooling gas discharge portion are vertically aligned such that a horizontal plane passes through the cooling gas introduction portion and the cooling gas discharge portion.

6. The equipment of claim 5, further comprising: a cooling gas introducing inlet configured to introduce cooling gas into the cooling gas introduction portion therethrough,
wherein the cooling gas discharge portion includes a cooling gas discharge outlet configured to discharge the cooling gas introduced into the cooling gas introduction portion to an exterior of the heating equipment,
wherein the cooling gas introducing inlet and the cooling gas discharge outlet are provided outside a heating region above the heating part.

7. The heating equipment of claim 6, wherein the cooling gas introducing inlet and the cooling gas discharge outlet are provided in the top plate.

8. The heating equipment of claim 5, wherein the top plate includes:
a lower heating-insulating plate provided to abut against the upper end of the heating part and including a flow hole formed at the center of the lower heating-insulating plate; and
a upper heating-insulating plate provided on the lower heating-insulating plate and including a groove horizontally extending from a center corresponding to the flow hole to a sidewall surface.

* * * * *